United States Patent [19]

Liptay

[11] Patent Number: 5,134,561
[45] Date of Patent: * Jul. 28, 1992

[54] COMPUTER SYSTEM WITH LOGIC FOR WRITING INSTRUCTION IDENTIFYING DATA INTO ARRAY CONTROL LISTS FOR PRECISE POST-BRANCH RECOVERIES

[75] Inventor: John S. Liptay, Rhinebeck, N.Y.

[73] Assignee: International Business Machines Corporation, Armonk, N.Y.

[*] Notice: The portion of the term of this patent subsequent to Feb. 13, 2007 has been disclaimed.

[21] Appl. No.: 435,647

[22] Filed: Dec. 5, 1989

Related U.S. Application Data

[62] Division of Ser. No. 75,483, Jul. 20, 1987, Pat. No. 4,901,233.

[51] Int. Cl.⁵ .................. G06F 9/32; G06F 9/42; G06F 12/02; G06F 9/46
[52] U.S. Cl. .................. 395/425; 364/243.41; 364/246; 364/247; 364/261.3; 364/262.4; 364/DIG. 1
[58] Field of Search ... 364/200 MS File, 900 MS File

[56] References Cited

U.S. PATENT DOCUMENTS

| | | | |
|---|---|---|---|
| 4,200,927 | 4/1980 | Hughes et al. | 364/200 |
| 4,390,946 | 6/1983 | Lane | 364/200 |
| 4,471,433 | 9/1984 | Matsumoto et al. | 364/200 |
| 4,477,872 | 10/1984 | Losq et al. | 364/200 |
| 4,566,063 | 1/1986 | Zolnowsky et al. | 364/200 |
| 4,574,349 | 3/1986 | Rechtschaffen | 364/200 |
| 4,612,612 | 9/1986 | Woffinden | 364/200 |
| 4,691,277 | 9/1987 | Kronstadt et al. | 364/200 |
| 4,722,049 | 1/1988 | Lahti | 364/200 |
| 4,725,947 | 2/1988 | Shonai | 364/200 |
| 4,733,346 | 3/1988 | Tanaka | 364/200 |
| 4,736,288 | 4/1988 | Shintani | 364/200 |
| 4,742,451 | 5/1988 | Bruckert et al. | 364/200 |
| 4,750,112 | 6/1988 | Jones | 364/200 |
| 4,752,873 | 6/1988 | Shonai | 364/200 |
| 4,755,966 | 7/1988 | Lee et al. | 364/900 |
| 4,760,519 | 7/1988 | Papworth | 364/200 |
| 4,760,520 | 7/1988 | Shintani | 364/200 |
| 4,763,245 | 8/1988 | Emma et al. | 364/200 |
| 4,777,594 | 10/1988 | Jones | 364/200 |
| 4,807,115 | 2/1989 | Torng | 364/200 |
| 4,831,515 | 5/1989 | Kamada | 364/200 |
| 4,833,599 | 5/1989 | Colwell et al. | 364/200 |
| 4,884,197 | 11/1989 | Sachs et al. | 364/200 |
| 4,901,233 | 2/1990 | Liptay | 364/200 |

FOREIGN PATENT DOCUMENTS 0106670 10/1983 European Pat. Off. .
0106670 4/1984 European Pat. Off. .

OTHER PUBLICATIONS

Pupa 62-47747, Patent Abstracts of Japan, Sect P, Section No. 601, vol. 11, No. 236, p. 73, Prefetching Control Processor.

(List continued on next page.)

Primary Examiner—Stuart N. Hecker
Assistant Examiner—George C. Pappas
Attorney, Agent, or Firm—Richard M. Ludwin

[57] ABSTRACT

A register management system has more physical registers for general purpose use than are named in the architectural system. A renaming system identifies particular physical registers to perform as architected addressable or general purpose registers. An array control list (ACL) is provided to monitor the assignment and status of the physical registers. A decode register assignment list (DRAL) is provided to monitor the status of all of the architected registers and the correspondence to physical registers. A back-up register assignment list (BRAL) is used to preserve old status information while out of sequence and conditional branch instructions are executed. The physical registers may retain multiple copies of individual addressable registers representing the contents at different stages of execution. The addressable register status may be restored if instruction execution is out of sequence or on a conditional branch causing a problem requiring restoration. The register management system may be used in a processor having multiple execution units of different types.

13 Claims, 5 Drawing Sheets

OTHER PUBLICATIONS

Pupa 61-45359, Patent Abstracts of Japan, Sect. P, Section No. 477, vol. 10, No. 202, p. 146, Information Processor.

Pupa 61-55741, Patent Abstracts of Japan, Sect P, Section No. 482, vol. 10, No. 220, p. 47, Arithmatic Processor.

Pupa 61-262933, Patent Abstracts of Japan, Sect P, Section No. 566, vol. 11, No. 116, p. 132, Control System for Electronic Computer.

IBM Technical Disclosure Bulletin, vol. 24, No. 3, Aug. 1981, pp. 1404-1405-"General Purpose Register Extension" by S. M. Desai.

IBM Technical Disclosure Bulletin, vol. 25, No. 1, Jun. 1982, pp. 86-87, "Vector-Register Rename Mechanism" by D. C. Tjon-Pian-Gi.

IBM Technical Disclosure Bulletin, vol. 29, No. 3, Aug. 1986, 991-993-"Use of a Second Set of General Purpose Registers to Allow Changing . . . Branch Resolution" by P. G. Emma et al.

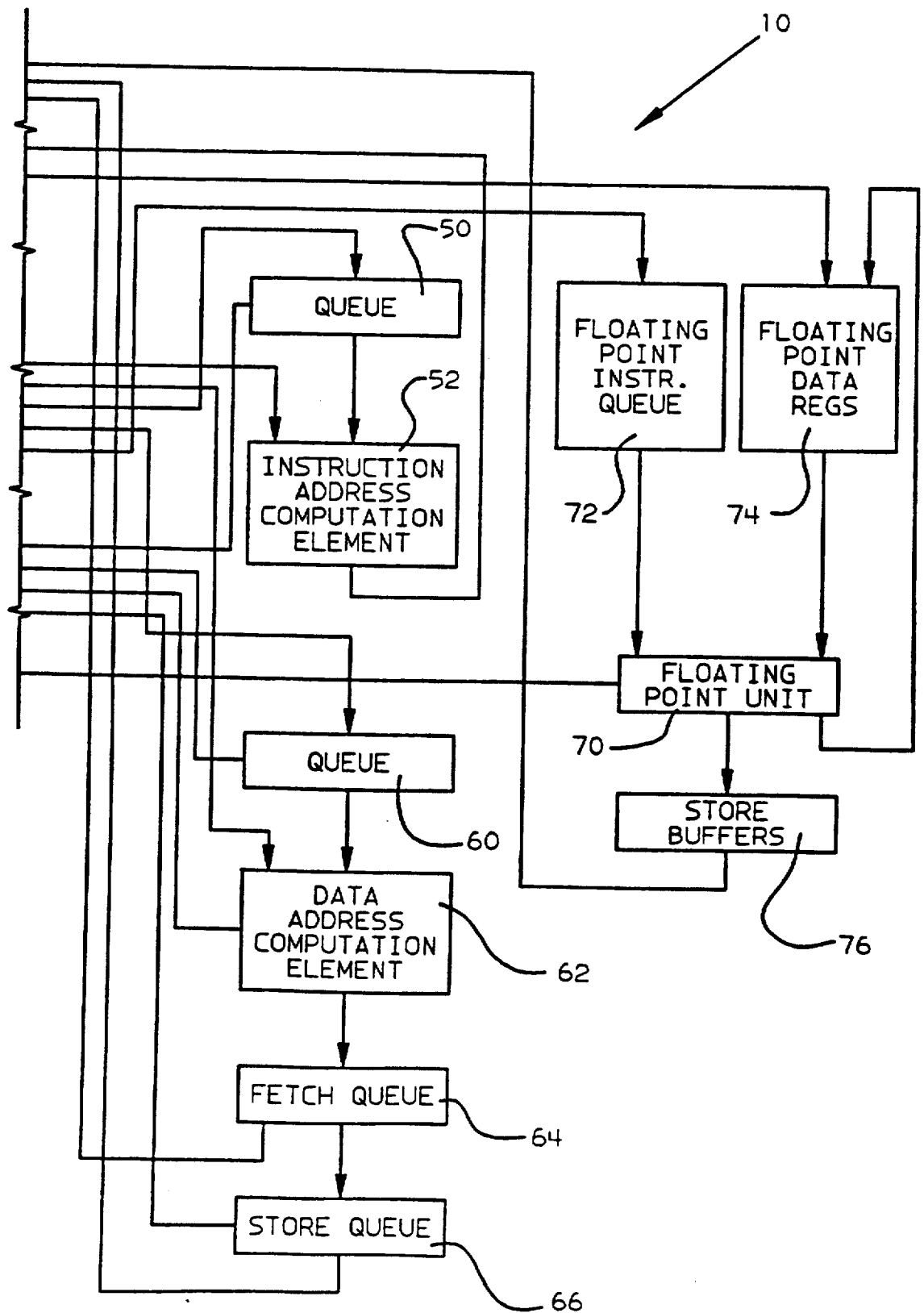

FIG.3

| | CTL | ABC | IID | PRV | REG |
|---|---|---|---|---|---|
| 0 | CTL | ABC | IID | PRV | REG |
| | CTL | ABC | IID | PRV | REG |
| | CTL | ABC | IID | PRV | REG |
| | CTL | ABC | IID | PRV | REG |
| | CTL | ABC | IID | PRV | REG |
| | CTL | ABC | IID | PRV | REG |
| | CTL | ABC | IID | PRV | REG |
| | CTL | ABC | IID | PRV | REG |
| | CTL | ABC | IID | PRV | REG |
| | CTL | ABC | IID | PRV | REG |
| | CTL | ABC | IID | PRV | REG |
| | CTL | ABC | IID | PRV | REG |
| | CTL | ABC | IID | PRV | REG |
| | CTL | ABC | IID | PRV | REG |
| | CTL | ABC | IID | PRV | REG |
| 31 | CTL | ABC | IID | PRV | REG |

110

COMPUTER SYSTEM WITH LOGIC FOR WRITING INSTRUCTION IDENTIFYING DATA INTO ARRAY CONTROL LISTS FOR PRECISE POST-BRANCH RECOVERIES

This is a division of application Ser. No. 075,483, filed Jul. 20, 1987, now U.S. Pat. No. 4,901,233.

FIELD OF THE INVENTION

This invention relates to the management of addressable registers in a computer central processor. More particularly, this invention relates to a control system and monitoring system for a register array for processing out-of-sequence instructions and providing a register content restoration process in branch instructions and interrupts. Such a system requires the retention of both the old and new contents of an addressable register while a sequence of instructions is completed. Addressable registers may include but are not limited to general purpose registers and floating point registers. An embodiment of the invention is shown relating to a computer processor conforming to the IBM 370 System architecture having a plurality of physical array registers to serve the function of a fixed number of addressable registers.

BACKGROUND OF THE INVENTION

The design of a typical computer system requires the establishment of a fixed number of addressable registers such as general purpose registers (GPR's) for the programmer to use in designing programs for the machine. Changing the number of architecturally available GPR's once a system is available would require substantial rewriting of programs to make use of the new number of GPR's.

Similarly, the design of computers and computer programs is based on the assumption that computer program instructions are executed by the computer in the order in which they are written and entered into the system. While instructions must logically appear to the computer system to have been executed in sequence, it has been learned in an effort to improve computer performance that some instructions do not have to be physically performed in sequence, provided that certain dependencies do not exist with other instructions. Further, if some instructions are executed out of order, and such an instruction is a branch instruction, where a branch prediction is made to select the instruction sequence, a need to restore the involved register to original values can occur if a wrong branch is predicted. In such a case the system is restored to the point where the branch is taken. The process of executing an instruction out of order efficiently requires that an established or old value be maintained for GPR's affected by the instruction while provision is made to contingently receive new values for the affected GPR's. The contingency is removed and the new value becomes the established value for the GPR's when intervening instructions have completed and branch instructions are resolved.

Large processors have for many years employed overlapping techniques under which multiple instructions are in various states of execution at the same time. Whenever such a technique is employed, it carries with it a need to implement control logic which detects dependencies between instructions and is able to alter the usual overlapped operation so that the results achieved are those described by the "one instruction at a time" architectural model. There are many different forms which overlapping can take, and each one has its own unique set of control problems.

A common form of overlapping is what is called pipelining. Oversimplified, a pipelined machine provides separate hardware for different stages of an instruction's processing. When an instruction finishes its processing at one stage, it moves to the next stage, and the following instruction may move into the stage just vacated. In such a machine, the instructions are kept in sequence with regard to any particular stage of their processing, even though different stages of processing for different instructions are occurring at the same time. In such a processor if the controls detect that a result which has not yet been generated is needed by some other instruction, then the controls must stop part of the pipeline until the result is generated and passed back to where it is needed. Although this control logic can at times be complex, the fact that instructions are kept in sequence in the pipeline is of definite help in keeping the complexity under control.

A more complex form of overlapping occurs if the processor includes separate execution units. Although less common, this technique has also been known and used for many years. Because different instructions have different execution times, and because the inter instruction dependencies will be variable, it is almost inevitable in such a processor that instructions will execute and produce their results in a sequence different from their sequence in the program. Keeping such a processor operating in a logically correct way requires a more complex control mechanism than that for the pipeline organization.

However, multiple execution units in the prior art do not allow precise interruptions to be taken at an arbitrary point. For example, if an instruction creates an overflow condition, by the time this is detected, it is entirely possible that a later instruction in the program is already executed and the result placed in a register or in main storage. This makes it impossible to take an interruption and preserve status of the processor with all prior but no subsequent instructions having executed. In this example, the overflow interrupt will actually be recognized later than it occurred. Other similar situations are possible in the prior art.

The designers of some prior machines chose to handle this situation by allowing all instructions which were in some state of execution to complete their execution as best they could, and then take an "imprecise" interruption which reported that some instruction in the recent past had an overflow condition. This is a reasonable way to handle interruptions for conditions like overflow where the results will be returned to a programmer who will fix a bug or correct the input data and then rerun the program from the beginning. However, it is an unacceptable way to handle interruptions like page faults where the system program will take some corrective action and then resume execution from the point of interruption.

Applicant is aware of U.S. Pat. No. 4,574,349 assigned to the same assignee as the present invention, in which additional registers are provided to be associated with each GPR and in which register renaming occurs with use of a pointer value. However, this patent does not solve the problem of precise recovery from interrupts or incorrectly guessed branches during out of sequence execution.

An article in the IBM Technical Disclosure Bulletin, entitled "General Purpose Register Extension", August 1981, pages 1404–1405 shows a system for switching between multiple GPR sets to avoid use of storage when switching subroutines. Another article in the IBM Technical Disclosure Bulletin, entitled "Vector-Register Rename Mechanism", June 1982, pages 86–87 shows the use of a dummy register during instruction execution. When execution is complete the register is renamed as the register named by the instruction for receiving results. During execution, the register is transparent and this allows for extra physical registers. However, neither of these articles deals with out-of-sequence instruction execution.

An article in the IBM Technical Disclosure Bulletin, entitled "Use of A Second Set of General Purpose Registers to Allow Changing General-Purpose Registers During Conditional Branch Resolutions", August 1986, pages 991–993 shows a one-for-one matched secondary set of GPRs to hold the original GPR contents during conditional branch resolution and restore the system status if necessary. Conditional mode tags are used with the GPRs to regulate status of the registers or to restore the original contents of the register.

SUMMARY OF THE INVENTION

The present invention provides a register management system for the addressable registers associated with the processor in a computer. The register management system provides for out of sequence execution of instructions and includes mechanisms for precise recovery from a wrong branch prediction or an interrupt where instructions are out of sequence.

The present invention assumes a central processor with an architecture having a fixed number of addressable registers for use by programs. A typical system would, for example, conform to the IBM System/370 architecture and the embodiment shown deals primarily with the GPRs in that architecture.

The present invention provides a register array (RA) having a plurality of registers which is greater than the number of architected registers. The number of registers actually provided may vary, and may be, for example, twice the number of architected registers.

As computer program instructions call for use of an addressable register in the architecture, a register in the RA is assigned to perform the function of the addressable register such as a System/370 GPR. The instruction also receives an Instruction Identifier (IID) number. A circular rotation of IID's may be used. An array control list (ACL) is provided which has an entry for each register in the RA. Each position in the ACL has several status fields relating to the associated register including a field indicating the availability status of the register, the IID assigned to the register and the name of the GPR assigned to the register. For purposes of the system architecture, once a register in the RA is assigned as a GPR it looks to the program the same as a permanent physical register with the same GPR number.

The register management system also includes a Decode Register Assignment List (DRAL) and one or more Back Up Register Assignment Lists (BRAL) associated with the RA and having one position for each GPR. Each position in the DRAL contains the number of the RA position assigned to the associated GPR. As each instruction is decoded, the GPR's it references are looked up in the DRAL to determine what RA positions are assigned to the GPR's referenced by the instruction. As new RA positions are assigned to receive results for GPR's, the DRALs are continuously updated with the new assignments.

There are one or more BRALs associated with the DRAL to freeze and preserve the status of the DRAL at a precise point in the program execution to restore the DRAL to that precise point when necessary. When a conditional branch is encountered, the DRAL at that point is copied into the BRAL. If a second branch is encountered, the DRAL at that point is copied into the second BRAL, if one is provided, or held up if one is not. A third BRAL, or even additional BRAL's may be provided as desired. Each BRAL serves to preserve the system status at a particular fixed time while the system goes forward with processing. The actual number of BRAL's provided is based on the system designers perception of the maximum number of possible situations requiring restoration of an earlier system status that may be in progress at one time. If enough BRAL's are not provided, execution would stop until a condition is resolved.

The ACL and the DRAL work together as instructions are decoded and completed to manage the contents of the RA according to the architected GPR which is the resource recognized by the program. When a new instruction is decoded, the registers which it references are looked up in the DRAL to find out what RA positions are assigned to them. Thereafter, the RA position addresses are used by the execution units rather than the GPR name. After the RA assignment is located in the DRAL, the ACL is accessed to determine the status and that information is forwarded to the execution unit.

When an instruction is completed, its IID is sent by the execution unit to the ACL for a compare with the IID's in the RA. For each RA position which has received a result from the same IID, control tags are changed to represent the completed status.

When a conditional branch is encountered, instructions are decoded in the direction of the guessed branch. As a requirement for completing instructions in sequence, the processor does not issue a completion signal for any instructions in a guessed branch before the branch taken is resolved. The control field in each ACL position is set for each new assigned RA position after the branch guess is taken so that each such assignment may be voided, if necessary.

The branch recovery technique when a branch guess is incorrect has implications for all parts of the processor. What it means for the register management process is that it is necessary to restore the GPR status to what it would have been if instruction decoding had stopped after the branch was reached. This process recognizes that since the branch was decoded, two types of updating to the GPR control status have taken place. One type reflects progress toward completion and actual completion of instructions prior to the branch, the effects of this updating must be retained. The second type of updating reflects the decoding and execution of instructions which follow the branch; this updating must be removed from the GPR status.

Since (except for interruptions) the DRAL is only updated when instructions are decoded and is not affected in any way by their completion, the contents of the DRAL would not have changed if no instructions had been decoded after the branch. Therefore, what is desired for the DRAL is to restore it to its status immediately following the decode of the branch. To accomplish this, the RA assignments revert to the correct status by restoring the appropriate BRAL if there is more than one, into the DRAL. Whenever a conditional branch is decoded, the contents of the DRAL immediately following the decode of the branch is moved to the BRAL. When the branch guess is resolved, the BRAL is either discarded or used to restore the DRAL.

An interruption control is provided to prevent any instructions beyond the point of interruption from completing. An interrupt can call for either the completion or suppression of the instruction that caused it. Prior instructions are allowed to complete to the point allowed by the particular interrupt. At this point the DRAL is in a non-current or irrelevant state because it contains entries which go beyond the interrupt. The ACL however, contains correct information for all RA positions in the assigned state. The ACL positions are cancelled and returned to available status for instructions beyond the interruption. The ACL is then used to provide current status values to the DRAL to recover from the interrupt.

In summary, the register management system of the present invention handles out of order instructions and branch instructions using a RA and a dual function control system. The first part of the control system, the DRAL, manages instructions from the viewpoint of the architectural GPR's. The second part of the control system, the ACL, manages the actual contents of the register array. This way a branch condition or an interrupt can be restored even if instructions are executed out of order.

BRIEF DESCRIPTION OF THE DRAWINGS

FIGS. 1A and 1B are the left and right halves, respectively, of a drawing of an embodiment of a computer system according to the present invention.

FIG. 3 is a detailed showing of the Array Control List (ACL) shown in FIG 2.

DESCRIPTION OF THE PREFERRED EMBODIMENT

The present invention is a register management system for a computer system having an architectural design requirement of a specified plurality of addressable (logical) registers such as general purpose registers, for example, n general purpose registers. A register array (RA) having m registers, where m is greater than n, is provided to fulfill the functions of the n general purpose registers. As an illustrative embodiment, a system according to the well known IBM System/370 Architecture having 16 GPR's is described. The RA according to the present invention provides dynamic assignment of particular RA positions to fulfill the functions of the architectural registers. When the function of a particular register assignment is completed, the position in the RA is released and may be reassigned as the same or another architectural GPR in due course.

Figure 1A:
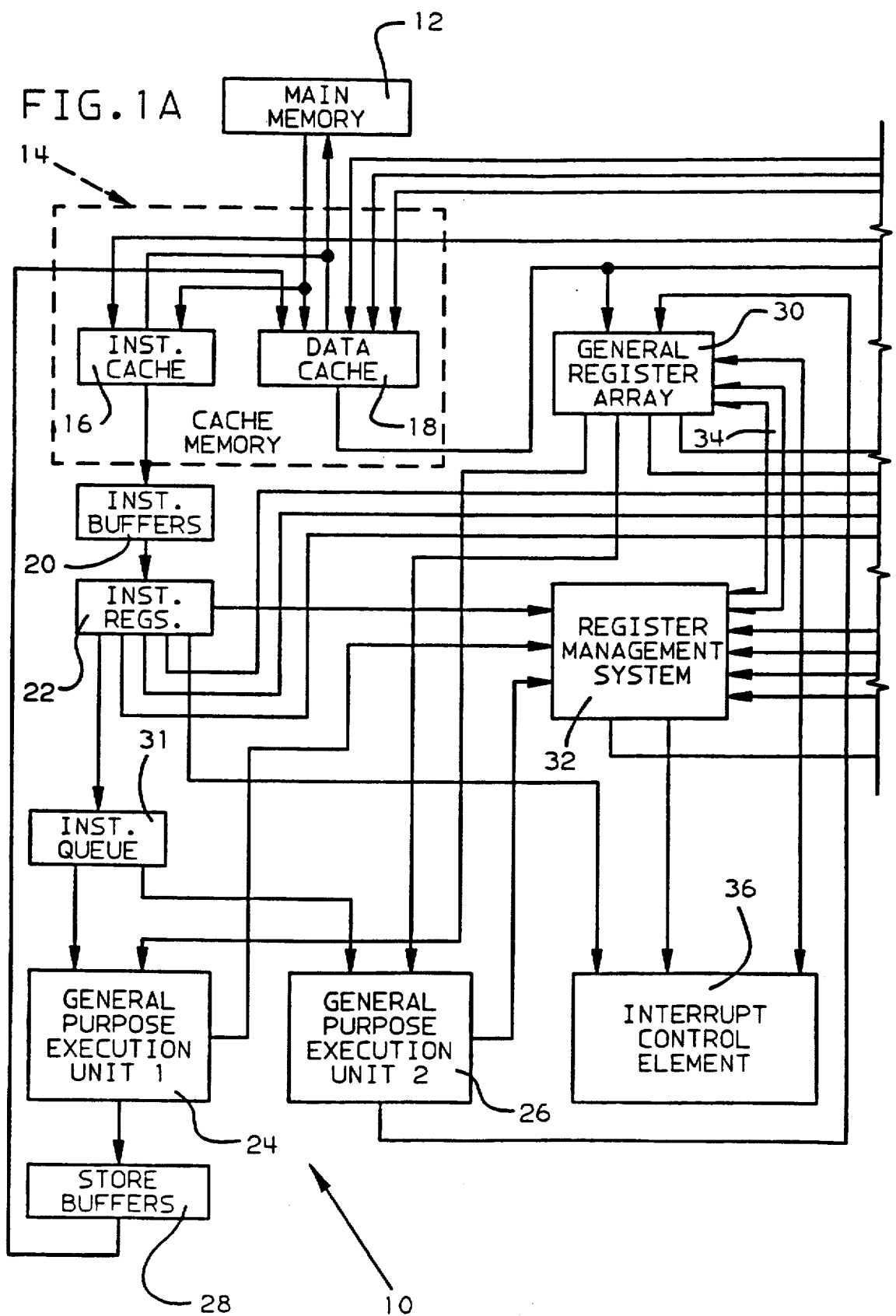

The register management system of the present invention is not dependent upon the overall computer architecture and may be implemented in a variety of environments. Thus, without limiting the scope of the invention, a computer system 10, shown in FIGS. 1A and 1B, according to the present invention, has a main memory 12 connected with a cache memory system 14. The cache memory system 14 may be organized in any number of acceptable ways but is shown in the present example with an instruction cache 16 and a data cache 18 both connected to main memory 12 for separate handling of instruction operations and data operations, respectively. It is known within the field of memory design to provide a cache memory with more than one level to provide both the advantages of memory speed and memory size in a cascaded arrangement and such a memory design, although not shown here, would also be consistent with the present invention.

Instructions pass from the instruction cache 16 through an instruction buffer unit 20 to an instruction register unit 22. For illustrative purposes, the instruction register unit 22 has more than one separate instruction registers, and two, three or four are desirable numbers of such instruction registers.

It is known in the field of computer design for a system to have more than one general purpose execution unit. For example, the general purpose units may be designed along the lines of the type of function performed, arithmetic or logical, scalar or vector, scalar or floating point, etc. Because any such arrangement of general purpose execution units makes use of general purpose registers, this invention is applicable to many variations in the number, function arrangement and design of the general purpose execution units in a computer.

For purposes of illustration, the present system is shown with general purpose execution units (GPE) 1 and 2, labeled 24 and 26, respectively. General purpose unit 24 has its output connected to a store buffer unit 28 which in turn has its output connected to data cache 18. General purpose unit 24 may actually be a single execution unit or a combination of units and, as shown in this embodiment, unit 24 produces results which go to store buffer 28 where they are held until instruction completion and then may be stored in memory. General purpose unit 26 has its output connected to a general register array (RA) 30, according to the present invention. GPE 26 operates on instructions which produce results which are required to be available in registers rather than immediately stored. An instruction stack or queue 31 is provided to receive instructions from the instruction register unit 22 and direct them appropriately to GPE 24 or 26. Multiple execution units of various types may be used with a single RA and register management system according to the present invention.

RA 30 contains 32 dynamically assignable real (physical) registers to fulfill the functions of 16 GPR's recognized by the architecture in this embodiment of the invention.

The RA 30 is controlled by and provides status information to the register management system (RMS) 32 through a control bus 34. The RMS 32 is connected to several other systems in order to receive and provide various types of status information. An interrupt control element 36 is connected to the instruction registers 22, the RMS 32 and the RA 30 to process the proper handling of interrupts and preserve the required status information.

The RMS 32 is connected to the instruction register unit 22 and GPE's 24 and 26 for the purpose of following instructions from issuance through execution and the assignment of registers for input operands and output operands.

The computer in this embodiment has an instruction queue 50 connected to receive instructions from instruction register unit 22 and having an output to instruction address computation element (I-ACE) 52. I-ACE 52 is also connected to receive inputs directly from RA 30 and has an output connected to the instruction cache 16. Instruction queue 50 is connected to the RMS 32 to provide status information.

The computer in this embodiment has an address queue 60 connected to receive an output from the instruction register unit 22. The output of address queue 60 is connected as an input to data address computation element (D-ACE) 62. The other input to D-ACE 62 is from RA 30. D-ACE 62 is connected to RMS 32 to provide status information.

The output of D-ACE 62 is connected to address fetch queue 64 which, in turn, has a first output connected as an input to data cache 18 and a second output connected as an input to address store queue 66. Address store queue has an output connected to data cache 18 and has a connection with RMS 32 to provide status information.

The computer in the present embodiment has a floating point arithmetic unit 70 which is also connected to the RMS 32 to provide status information. As will be explained, it is important to note that the RMS 32 can work with units and registers not associated with RA 30. For example, one RMS may work with more than one register array. To be more specific, one RMS may control two RAs which in turn may be connected with multiple execution units of the same or different types.

The inputs to floating point unit (FPU) 70 are provided by a floating point instruction queue 72 and by floating point data registers unit 74. Floating point instruction queue 72 receives its input from I-REG 22. Floating point data register unit 74 receives its input from data cache 18 and from FPU 70. The output of floating point unit 70 is connected to store buffer unit 76 which has its output connected as an input to data cache 18.

Figure 2:
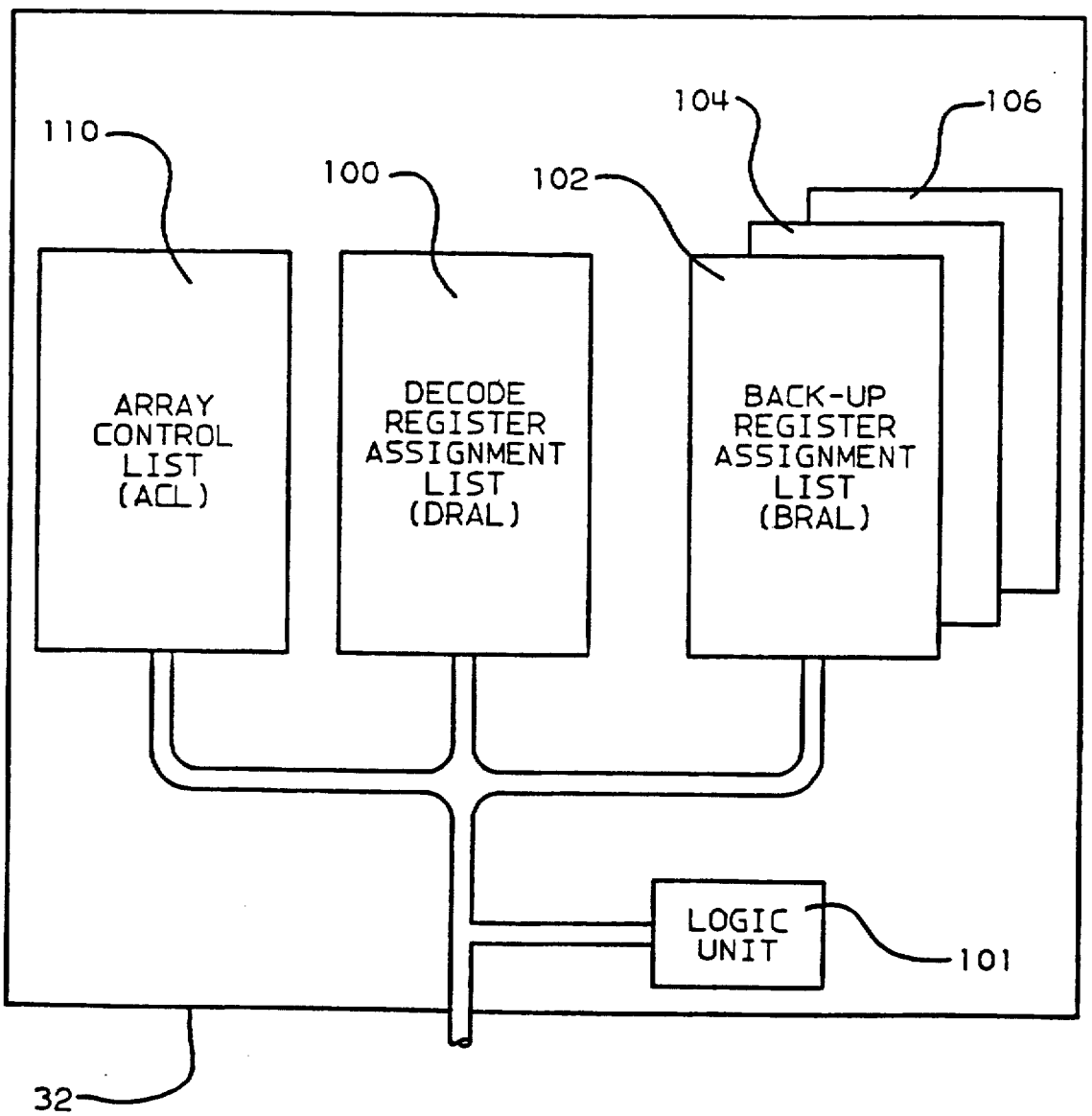
FIG. 2 is a detailed drawing of the register management system of the present invention from the embodiment shown in FIG. 1.

Referring now to FIG. 2, the detailed structure of the register management system 32 is shown. A Decode Register Assignment List (DRAL) 100 is connected to incoming and outgoing status and control lines. Logic unit 101 is also connected to incoming and outgoing status and control lines for monitoring and controlling the contents of the DRAL. The DRAL is used when instructions are decoded to translate GPR assignments into RA assignments. The DRAL may be organized in different ways. There may, for example, be more than one DRAL with multiple copies at each DRAL which contains one position for each GPR, and that position contains the number of the RA position that has been most recently assigned to receive value for that GPR. As each instruction is decoded, the GPR's it references are looked up in the DRAL to determine what RA positions are assigned to the GPR's, and as new RA positions are assigned to receive results, the DRAL is updated to reflect these assignments. In this way, each instruction which uses a GPR is directed by the DRAL to find the RA position which is assigned to the most recent instruction to reference that GPR.

Back-up Register Assignment Lists 102, 104 and 106 are connected to receive the entire contents of the DRAL 100 at particular points of operation. There is normally at least one BRAL in the system corresponding to each DRAL. The register management system could work with no BRALs if the system was allowed to wait for branch resolution. The use of one, two or three BRALs allows the processing of one, two or three conditional branches respectively, without waiting. It has the same structure as the DRAL, and is connected to it in such a way that in one cycle the entire contents of the DRAL may be copied into the BRAL, or vice versa. These transfers are controlled by logic unit 101. It is used, for example, when a conditional branch is encountered to save the contents of the DRAL in case the guess as to whether the branch taken is wrong.

If only one BRAL is provided for each DRAL, it is normally possible to decode past only one conditional branch. However, in the special case where a second conditional branch is encountered with no intervening instructions that change GPR's, it is possible to decode past that branch also because the same DRAL contents is saved for both branches in the BRAL.

Figure 4:
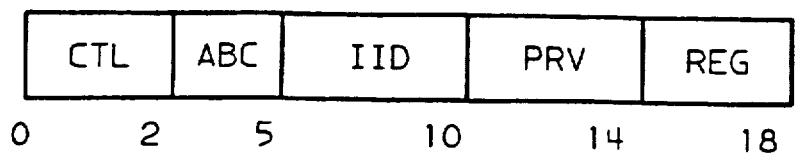
FIG. 4 is the field arrangement for the entries in the ACL shown in FIG. 3.

An Array Control List (ACL) 110 is connected to receive status information and send control information from the RA and the rest of the computer system. Logic unit 101 controls the contents of ACL 110 and coordinates the operation of the ACL and the DRAL. For each of the RA's which support the GPR's there is an ACL register which remembers status information related to that RA. There is one entry for each register position in the array, each entry, in this embodiment, consisting of 14 bits divided into five fields as shown in FIGS. 3 and 4: CTL, ABC, IID, PRV and REG. CTL is a control field which defines the overall status of the RA position. It may have the following values:

00: AVAILABLE—the RA position is not in use, and if needed it may be assigned. When CTL="00", the ABC, IID, PRV, and REG fields have no meaning.

01: ASSIGNED—the RA position is assigned to the GPR designated by the REG field. If an interruption were taken with the current instructions completed, this is the RA position which corresponds to that GPR. At any given moment there is one and only one RA position assigned to each GPR. When CTL="01", the ABC field is "000", and the IID and PRV fields have no meaning.

10: PENDING AND NOT YET LOADED—the RA position has been assigned to receive the result of an instruction which has not yet completed execution, and thus far the instruction has not loaded its result into this RA position. The IID field is the IID assigned to the instruction for which this RA position will receive a result. The ABC field is nonzero if this instruction has been issued conditionally and "000" otherwise. In most cases, the REG field is the number of the GPR for which this RA position is receiving a result; and the PRV field is the number of the RA position which holds the old value of that GPR. In the special case of compare instructions which do not change a GPR, an RA position is assigned anyway, the REG field is irrelevant, and the PRV field contains the number of this RA position.

11: PENDING AND LOADED—the RA position is assigned to receive the result of an instruction which has not yet completed execution, and it has received that result. The ABC, IID, PRV and REG fields have the same meaning as when CTL="10", except that the special case for compare instructions does not occur in this state.

The ABC field is used to identify the RA positions which are associated with instructions that are decoded beyond a conditional branch. It is not necessary to implement such a field in order to make the invention work since this information could be determined by examining the IIDs. However, this field is implemented in this embodiment because it is more economical and faster to have a field devoted to remembering this one piece of information, than to determine it at periodic intervals by performing a test of the IIDs.

In the present case where three BRALs are provided so that up to three conditional branches may be encountered, the ABC field has three bits which are initially set to be "000". When a first branch is encountered, the first BRAL is loaded with the DRAL contents and the ABC field is changed to "100" to indicate loading of the BRAL and the presence of an unresolved branch. If a second branch is encountered before the first branch is resolved, the second BRAL is loaded with the contents of the DRAL at that time and the ABC field is changed to "110". Finally, if a third branch is encountered and the first two branches are unresolved, the third BRAL receives the DRAL contents at that time and the ABC field becomes "111". Each bit in the ABC field is independently associated with a particular BRAL to show that the BRAL is active and storing particular DRAL contents for an unresolved branch. Logic unit 101 controls these functions.

If a branch is resolved favorably, the assigned BRAL contents will not be needed and the appropriate bit in the ABC field is set to 0. Referring to the previous example, branches do not necessarily have to be resolved in the order of occurrence. If a first branch occurs (ABC="100") and then a second branch occurs (ABC="110"), the second branch may be resolved first and the ABC field is simply reset to "100". If, as in the earlier example, three branches occur in order (ABC="111") and the second branch is resolved first the second BRAL becomes available and the ABC field is set to "101". In addition, this means that a BRAL is available if another branch is encountered. The bits in the ABC field can be set and reset in any order representing branch occurrence and resolution in any order. Thus, if the ABC field is "101" a new branch may be encountered and set the B bit so that the ABC field becomes "111"even though this does not represent the order of branch occurrence.

Figure 5:
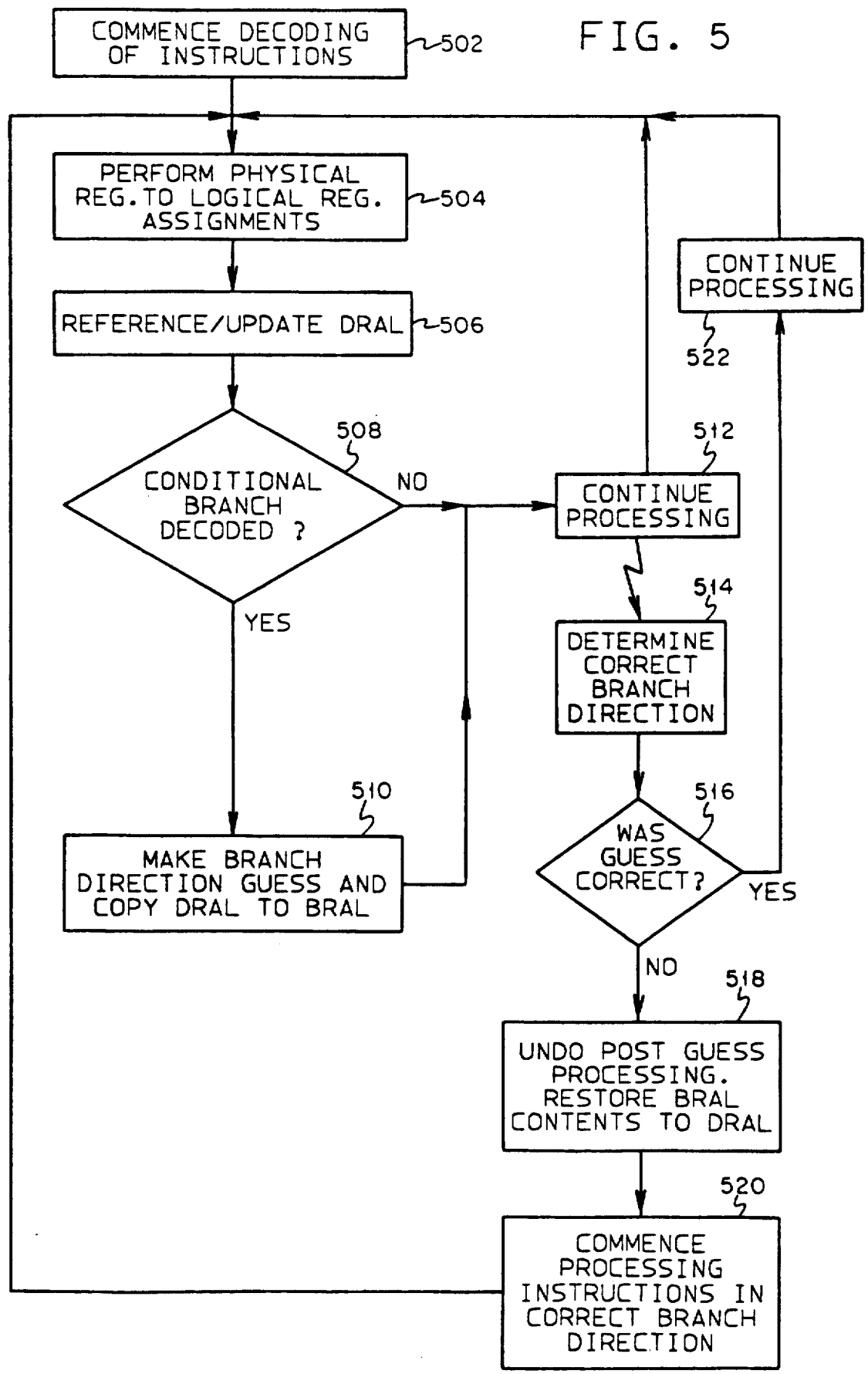
FIG. 5 is a flow diagram showing conditional branch processing in the system of FIGS. 1A and 1B.

When an instruction is decoded (FIG. 5, STEP 502), the GPR's which it references are looked up in the DRAL to find out what RA positions are assigned to them. This includes both GPR's which are used and GPR's which are changed (STEPS 504, 506). If the instruction changes GPR values, RA positions are assigned to receive the new values and the DRAL is updated so that those new RA positions become the ones which are shown as associated with those GPR's. The RA position assignments are then passed to the execution logic rather than the actual assignments of the GPR's.

If it is assumed that the processor has the ability to decode two instructions at a time, then the DRAL provides the ability to look up an R1, R1+1, X and B register (referring to the 370 instruction format) for each of them. Referring to architectures generally, an instruction may call for GPR's for an index value and a base value to provide the required memory access. This is adequate for most instructions, and in cases where it is not adequate, multiple cycles are required to decode.

A load multiple instruction may reference up to 16 GPR's in the System/370 architecture. After each GPR is looked up in the DRAL, the RA positions thus found are looked up in the ACL to determine whether the RA position is loaded, and this information is sent to the execution unit with the instruction. The RA position is considered loaded if it is in the ASSIGNED or PENDING AND LOADED states (CTL="X1").

The processor provides the ability to assign at least two new RA positions each cycle. For example, the GPRs may be arranged in two groups, one even and one odd with a separate RA for each group of GPRs. Then four GPRs could be assigned each cycle, two from each group of GPRs corresponding to the two RAs. The circuitry which accomplishes this examines the CTL field in ACL, and selects the first RA position in the AVAILABLE state (CTL="00"). If an RA position is assigned, then it is set to the ASSIGNED AND NOT YET LOADED state (CTL="10"), the I field is set with the IID of the instruction for which the assignment is being made, the REG field is set with the number of the GPR, and the PRV field is set with the number of the nz position previously assigned to that register (as determined by looking it up in the DRAL), except in the case of compare instructions in which case the PRV field is set to point to this RA position which is just being assigned. The reason for having an RA position assigned to compare instructions, and for this manner of operation is described in greater detail later.

This control structure for the RA imposes some conditions on instruction decoding.

1. Although the ability to look up registers in the DRAL meets the needs of the majority of instructions, there are some that have different requirements. These instructions take more than one cycle to decode. A partial list of such instructions in the System/370 architecture are: MVCL, CLCL, AXR, SXR, LM, STM, EDMK and TRT.

2. The ability to assign more than one RA position per cycle in each set of registers is important in some situations. A partial list of 370 architecture instructions which can change more than a single even/odd general register pair, or more than one floating point register is MVCL, CLCL, AXR, SXR and LM. These instructions cannot decode in a single cycle unless enough RA positions can be assigned in one cycle. Beyond the problems of individual instructions, this also puts requirements on what instructions can decode simultaneously. It is not possible to decode simultaneously any two instructions which change too many registers within the same set.

3. In order for the DRAL to work properly it is necessary that when a register position is looked up at decode time that the DRAL contain the number for RA positions which were assigned to receive the result of the most recent preceding instruction which changed that register. This is no problem unless that instruction is the immediate preceding instruction and the processor is attempting to decode both instructions at the same time. To handle this situation, whenever one instruction changes a register and the following instruction references that register, the second instruction is not permitted to decode at the same time as the first one.

As each instruction is completed, its IID is sent to the ACL. A compare is performed by logic unit 101 against all of the IID fields in the ACL to determine which RA positions have received results from this instruction. Then for each of the RA positions thus identified a signal is created which changes its state from PENDING AND LOADED to ASSIGNED (change CTL from "11" to "01"). Also, for each of those RA positions, the PRV field is examined to determine which RA positions need to be made available. For each of the RA positions pointed to by the PRV fields a signal is generated which changes its state from ASSIGNED to AVAILABLE (change CTL from "01" to "00").

All of the logic which performs these functions operates in parallel. Thus, in one cycle all of the RA positions containing old register values for the completed instruction are changed to the available state, and all of the RA positions containing new values are changed to the assigned state. The normal completion of instructions has no effect on the DRAL.

In theory, a branch is considered to be a conditional branch if it is not possible to tell whether it is taken by examination of the instruction itself. The 370 branches which fall into this category are BC(M≠0 or F and R2≠0), BCT, BCTR(R2≠0), BXLE and BXH. Whenever one of these branches is decoded (FIG. 5, STEP 508) the I element makes a decision about whether the branch should be guessed taken or not taken (STEP 510). It then proceeds to decode, and execute instructions in the direction guessed (STEP 512) while the processor is determining whether the branch really goes that way (STEP 514). The only thing the processor cannot do is complete those instructions since they logically follow the branch and cannot complete before it does. During this period of time all new RA positions selected to receive register values have the ABC field set to "1" in their entries for the BRAL assigned to that branch. At some, later time when the branch's direction is definitely determined (STEP 516) it may be necessary to undo all of the instruction processing past the branch (STEP 518), and start processing instructions in the other direction (STEP 520).

In practice, all branches of any type are treated as conditional because of the common use of a branch history table (BHT) to identify the target address of the branch instruction. The location of the target address in the BHT makes the instruction conditional at least until the correct target address is determined. When the BHT first identifies a target address, it is not clear until later that the target address is correct. At the time the correctness of the target address is resolved, the conditional status of the branch is removed.

Branch recovery from a failed branch has implications for all parts of the processor. What it means for the register management system is that it is necessary to restore the GPR status to what it would have been if instruction decoding had stopped after the branch was reached. In the interim since the branch was decoded, two types of updating to the register control status have taken place. One type reflects progress toward completion and actual completion of instructions prior to the branch; the effects of this updating must be retained. The second type of updating reflects the decoding and execution of instructions which follow the branch; this updating must be removed from the GPR status as being invalid or meaningless.

Normally the DRAL is only updated when instructions are decoded and is not affected in any way by their completion. Thus, the contents of the DRAL are not changed if no instructions are decoded after a branch. The situation of an interrupt is different and will be described separately. Therefore, what is desired for the DRAL is to restore it to its status immediately following the decode of the branch. This is accomplished by using the BRAL. Whenever a conditional branch is decoded, the contents of the DRAL immediately following the decode of the branch is moved to the BRAL at the time the appropriate bit in the ABC field is set to (FIG. 5, STEP 510) "1". It is saved there until it is determined whether the guess for the branch was right or wrong and it is then either discarded (part of STEP 522) or restored to the DRAL (STEP 518).

Restoring the ACL to the correct status is required after a wrong conditional branch. All of the ACL entries which were made after the conditional branch was decoded are identified by having the ABC field set to "1" in the particular bit position used for the BRAL for that particular branch. These entries are all for RA positions which were in the AVAILABLE state at the time the conditional branch was decoded, or which were placed in the AVAILABLE state after that by the completion of some earlier instruction and then picked up for reuse by some instruction after the conditional branch. None of these RA positions can have proceeded beyond one of the PENDING states since none of the instructions beyond the conditional branch can have completed. If no instructions beyond the conditional branch have been decoded, then all of these RA positions would be in the AVAILABLE state, and that is what they should be returned to.

The RA positions which have the ABC field set to "0" for the particular branch include the set of RA positions that is in the ASSIGNED state, and those which are associated with some pending instruction prior to the conditional branch. If no decoding beyond the branch has occurred, these entries should remain in the same state that they are in, and therefore, they should be left alone. Therefore, the procedure for restoring the ACL to its correct state after a wrongly guessed conditional branch is to set to the AVAILABLE state (CTL="00") all ACL entries for which ABC="1" in the particular bit position for the branch. If a conditional branch is found to have been guessed correctly, then all of the ABC bits in the ACL are set to "0" for the particular bit position for the branch.

A branch is considered to be unconditional if it can be determined by inspection at decode time that it is taken. Unconditional branch instructions create no uncertainty about how instruction processing is to proceed, and therefore the register management controls take no note of them. BAL and BALR are 370 instructions which fall into this category and also change a GPR; and they are therefore treated as any other instruction which changes a register. In machines with a BHT there may be no instructions in this category.

Interruptions need to be handled somewhat differently than other situations. As soon as an interruption condition is detected, a signal is sent to the interruption control element 36. This system interacts with the instruction completion controls to prevent any instructions beyond the point of interruption from completing. The point of interruption is either immediately before or immediately following the instruction which caused it, depending on whether the type of interruption calls for suppression or completion of the instruction. Those instructions prior to the point of interruption are then allowed to complete. At that point the DRAL contents reflect actions that would have been taken if some number of instructions beyond the one causing the interruption had been executed.

The ACL is in a state where all of the RA positions which are in the ASSIGNED state are the ones which contain the correct values for the assigned GPR's. In addition, the ACL may have a number of RA positions which are in one of the PENDING states. These are all associated with instructions beyond the point of interruption, and the next step is for all of these RA positions to be returned to the AVAILABLE state (if CTL="1X" it is set to "00"). The ACL is set to the correct state, and it is necessary to bring the DRAL to a corresponding state.

The DRAL is set over a period of several cycles by stepping a counter through each of the GPR addresses. As it steps through a new value each cycle, the value is compared against each of the ACL entries. This function can be accomplished by logic unit 101. A compare is detected if the REG field matches the value in the counter and the RA position is in the ASSIGNED state (CTL="01"). Since there must be exactly one RA position assigned to each GPR, this compare process must produce a compare against exactly one RA position every cycle. The result of these compares is encoded to produce the number of the RA position, and these RA position numbers are sent to the DRAL and sequentially written into the DRAL entries. At the end of this process, each of the DRAL entries points to the RA position which is assigned to the GPR that that entry corresponds to respectively, which is the correct state for the DRAL.

The process of restoring the DRAL to its correct state can be performed while the process of swapping program status words (PSWs) is occurring so that it does not add any time to the interruption process.

While the invention has been described with reference to the preferred embodiments thereof, various modifications and changes may be made to those skilled in the art without departing from the true spirit and scope of the invention as defined by the claims hereof.

Having thus described my invention, what I claim as new and desire to secure by Letters Patent is:

1. A register management system for use in a computer having a first number of architected logical registers and provision for executing a stream of instructions following a conditional branch instruction based on a branch direction guess, and provision for determing correctness of said branch direction guess, wherein a plurality of said instructions in said stream comprise a field designating an address of a first one of said logical registers, said register management system comprising:
 a register array coupled with said computer system, said register array comprising a second number of physical registers, said second number of physical registers being larger than said first number of logical registers,
 a first list, comprising said first number of entries, each of said entries corresponding to one of said logical registers and comprising a field indicative of one of said physical registers,
 a second lost comprising said first number of entries,
 a third list comprising said second number of entries, each of said entries in said third list corresponding to one of said physical registers and comprising an instruction identification field indicative of one instruction in said stream of instructions, a branch status field indicative of presence of an unresolved branch instructions and a control field indicative of a state of use of one of said physical registers, and
 logic means, coupled with said computer, said first list said second list, and said third list, for:
 performing assignment of first and second ones of said physical registers to said first one of said logical registers responsive to said state of use, writing first data indicative of said assignments into said first list, and writing data indicative of first and second instructions in said plurality into respective ones of said instruction identification field corresponding to said first and second physical registers;
 transferring said first data indicative of said assignments from said first list to said second list responsive to decoding of a conditional branch instruction by said computer, and writing third data indicative occurrence of said conditional branch instruction in said branch status field; and
 transferring said first data indicative of said assignments from said second list to said first list responsive to a determination by said computer that said branch direction guess is not correct.

2. A system of claim 1 wherein in said second list is one of a plurality of back-up register assignment lists in said system, and wherein said logic means comprises means for copying the contents of said first list to a different one of said back-up register assignment lists upon decoding of each of a plurality of conditional branch instructions and for copying said contents back into said first list from each of said back-up register assignment lists, and
 wherein said third at a comprises a plurality of bits, each of said bits corresponding to one of said back-up register assignment lists and being indicative of occurrence of one of said plurality of conditional branch instructions.

3. A register management system for use in a computer system having a first number of architected logical registers, provision for executing a stream of instructions following a conditional branch instruction based on a branch direction guess, and provision for determining correctness of said branch direction guess, comprising:
 a register array coupled with said computer system, said register array comprising a second number of physical registers, said second number of physical registers being larger than said first number of logical registers,
 a first list comprising said first number of entries, each of said entries in said first list corresponding to one of said logical registers and comprising a field indicative of one of said physical registers,
 a second list comprising said first number of entries, logic means, coupled with said computer system, said first list, and said second list, for copying contents of said first list to said second list responsive to decoding of a conditional branch instruction by said computer system, and for copying back said contents from said second list to said first list responsive to a determination by said computer system that said branch direction guess is not correct.

4. The system of claim 3 wherein said second list is one of a plurality of back-up register assignment lists in said system, and wherein said logic means comprises means for copying the contents of said first list to a different one of said back-up register assignment lists upon decoding of each of a plurality of conditional branch instructions and for copying said contents back into said first list from each of said back-up register assignment lists.

5. A method of managing registers in a computer system having a first number of architected logical registers, a second number, greater than said first number, of physical registers, provision for processing a stream of instructions including a conditional branch instruction, provision for processing ones of said instructions following said conditional branch instruction based on a branch direction guess, and provision for determining whether said branch direction guess was correct, wherein a plurality of said instructions in said stream include a field addressing a first one of said logical registers, comprising the steps of:

decoding a first instruction in said plurality;

responsive to said decoding of said first instruction, performing assignment of a first one of said physical registers to receive data for said first one of said local registers;

storing first data indicative of said assignment of said first one of said physical registers in a first table;

decoding said conditional branch instruction;

responsive to said decoding of said conditional branch instruction, copying said first data indicative of said assignment from said first table into a second table;

after said copying, decoding a second instruction in said plurality;

responsive to said decoding of said second instruction, assigning a second one of said physical registers to receive data for said first one of said logical registers;

storing second data indicative of said assignment of said second one of said physical registers in said first table;

after said decoding of said second instruction, determining if said branch direction guess was correct; and responsive to a determination by said determining step, that said branch direction guess was not correct, copying said first data back from said second table into said first table.

6. A register management system for use in a computer system having a first number of architected logical registers, provision for processing a stream of instructions following a conditional branch instruction based on a branch direction guess, and provision for determining correctness of the branch direction guess, comprising:

an array of storage elements coupled to the computer system, said array comprising a second number of said storage elements, said second number being larger than said first number of logical registers;

assignment means, coupled to the computer system, for assigning ones of said storage elements to receive data for the logical registers;

maintenance means, coupled to said assignment means, for maintaining information indicative of which of said storage elements is assigned to receive data for which of said logical registers; and, backup means, coupled to said maintenance means and the computer system, for making a backup copy of said information, responsive to detection of conditional branch instruction by the computer system and for restoring said information to said maintenance means responsive to a determination by the computer system that the branch direction guess was not correct.

7. The register management system of claim 6, wherein said storage elements are physical registers.

8. The register management system of claim 6, wherein said backup means is responsive to decoding of said conditional branch instruction by said computer system.

9. The register management system of claim 6, further comprising availability means for storing data indicative of available ones of said storage elements, said availability means being coupled to said assignment means.

10. The register management system of claim 6, further comprising interrupt means, for detecting an interrupt in said computer system and for restoring said maintenance means to a state existing just prior to said interrupt, said interrupt means being coupled to said computer system and said maintenance means.

11. The register management system of claim 6 wherein said maintenance means comprises a register assignment list having said second number of entries, each of said entries corresponding to a respective one of said storage elements and comprising a field indicative of at least one of said logical registers.

12. The register management system of claim 11 wherein said backup means comprises a backup register assignment list having said first number of entries.

13. The register management system of claim 11 wherein said backup means comprises a plurality of backup register assignment lists, each having said first number of entries.

* * * * *